(12) United States Patent
Peng

(10) Patent No.: US 10,228,431 B2
(45) Date of Patent: Mar. 12, 2019

(54) GRADIENT COIL AND MAGNETIC RESONANCE IMAGING SYSTEM

(71) Applicant: Siemens Healthcare GmbH, Erlangen (DE)

(72) Inventor: Wei Ping Peng, Shenzhen (CN)

(73) Assignee: Siemens Healthcare GmbH, Erlangen (DE)

(*) Notice: Subject to any disclaimer, the term of this patent is extended or adjusted under 35 U.S.C. 154(b) by 342 days.

(21) Appl. No.: 14/991,217

(22) Filed: Jan. 8, 2016

(65) Prior Publication Data

US 2016/0202333 A1 Jul. 14, 2016

(30) Foreign Application Priority Data

Jan. 8, 2015 (CN) .............. 2015 2 0009632 U

(51) Int. Cl.
*G01V 3/00* (2006.01)
*G01R 33/385* (2006.01)

(52) U.S. Cl.
CPC .............. *G01R 33/3858* (2013.01)

(58) Field of Classification Search
CPC .. A61B 5/055; G01R 33/5608; G01R 33/543; G01R 33/385; G01R 33/5659

USPC ........................................... 324/322
See application file for complete search history.

(56) References Cited

U.S. PATENT DOCUMENTS

| | | | | |
|---|---|---|---|---|
| 5,786,695 A | * | 7/1998 | Amor | G01R 33/3873 324/319 |
| 6,441,614 B1 | * | 8/2002 | Edelstein | G01R 33/3856 324/307 |
| 2006/0289482 A1 | * | 12/2006 | Nojima | H05B 6/145 219/619 |

* cited by examiner

*Primary Examiner* — Walter L Lindsay, Jr.
*Assistant Examiner* — Frederick Wenderoth
(74) *Attorney, Agent, or Firm* — Schiff Hardin LLP

(57) ABSTRACT

A gradient coil for a magnetic resonance imaging system has a primary coil set in a cylindrical shape, a secondary coil set cylindrically sheathed on an outer periphery of the primary coil set, and one or more support structures located on the outer periphery of the primary coil set to support the secondary coil set in a radial direction of the gradient coil. This gradient coil can reduce the costs of filling material, reduce the time for assembling the gradient coil, and reduce the risk of breaking the gradient coil during demolding from a shimming mold.

9 Claims, 3 Drawing Sheets

GRADIENT COIL AND MAGNETIC RESONANCE IMAGING SYSTEM

BACKGROUND OF THE INVENTION

Field of the Invention

The present invention relates to the technical field of magnetic resonance imaging, and particularly to a gradient coil.

Description of the Prior Art

Magnetic resonance imaging (MRI) is a technology in which the phenomenon of magnetic resonance is utilized for the purpose of imaging. The basic principles of magnetic resonance are as follows: when an atomic nucleus contains a single proton, as is the case with the nuclei of the hydrogen atoms that are present throughout the human body, this proton exhibits spin motion and resembles a small magnet. The spin axes of these small magnets lack an adhesive pattern, but when an external magnetic field is applied, the small magnets will be rearranged according to the magnetic force lines of the external magnetic field. Specifically, they will align in two directions, either parallel or anti-parallel to the magnetic force lines of the external magnetic field. The direction parallel to the magnetic force lines of the external magnetic field is called the positive longitudinal axis, while the direction anti-parallel to the magnetic force lines of the external magnetic field is called the negative longitudinal axis. The atomic nuclei only have a longitudinal magnetization component, which has both a direction and a magnitude. A radio frequency (RF) pulse of a specific frequency is used to excite the atomic nuclei in the external magnetic field such that their spin axes deviate from the positive longitudinal axis or negative longitudinal axis, giving rise to resonance—this is the phenomenon of magnetic resonance. Once the spin axes of the excited atomic nuclei have deviated from the positive or negative longitudinal axis the atomic nuclei have a transverse magnetization component.

Once emission of the RF pulse has ended, the excited atomic nuclei emit an echo signal, gradually releasing the absorbed energy in the form of electromagnetic waves, such that their phase and energy level both return to the pre-excitation state. An image can be reconstructed by subjecting the echo signal emitted by atomic nuclei to further processing, such as spatial encoding.

FIG. 6 is a schematic illustration in a radial cross section, of a gradient coil of a magnetic resonance imaging system according to the prior art. The gradient coil 500 is an important assembly in a magnetic resonance imaging (MRI) system. Generally, as shown in FIG. 6, the gradient coil has two coil sets: a primary coil set 501 for generating a positive gradient magnetic field, and a secondary coil set 502 for generating a negative gradient magnetic field. The primary coil set 501 is formed in a cylindrical shape; and the secondary coil set 502 is cylindrically sheathed on an outer periphery of the primary coil set. The secondary coil set is used to shield an eddy current from the primary coil set to a magnet. Each of the primary coil set 501 and the secondary coil set 502 comprises X, Y and Z layers of coils.

The magnetic resonance system has, between the primary coil set and the secondary coil set, a number of shimming slots 503 that are disposed between the primary coil set 501 and the secondary coil set 502 in a circumferential direction of the gradient coil.

The shimming slots are manufactured as follows. A shimming strip mold is provided for supporting the secondary coil set during the assembly. The shimming strip mold is fixed between the primary coil set and the secondary coil set in an axial direction of the gradient coil with two ends of the shimming strip mold. Epoxy resin is poured between the primary coil set and the secondary coil set; and after pouring, the shimming strip mold is ejected out of the whole gradient coil, so as to form shimming slots.

During the manufacture of the shimming slots, the shimming strip mold may possibly be distorted and deformed under the huge force of the secondary coil set, and when the shimming strip mold is ejected out, the epoxy resin may be ruptured due to deformation.

SUMMARY OF THE INVENTION

An object of the present invention is to provide a gradient coil for a magnetic resonance imaging system that can be fabricated in an improved manner.

This object is achieved by a gradient coil in accordance with the invention that has a primary coil set in a cylindrical shape, a secondary coil set cylindrically sheathed on an outer periphery of the primary coil set, and one or more support structures located on the outer periphery of the primary coil set to support the secondary coil set in a radial direction of the gradient coil.

The gradient coil further has a number of shimming slots disposed between the primary coil set and the secondary coil set in a circumferential direction of the gradient coil, and a first filling structure located in regions between the primary coil set and the secondary coil set except the shimming slots and the support structures.

The support structure has a raised face fitting with an inner surface of the secondary coil set; a recessed face fitting with an outer surface of the primary coil set, and a support body located between the raised face and the recessed face.

The support body has one or more support ribs, which extend in a radial or circumferential direction of the gradient coil.

The gradient coil further has a second filling structure located between the more than one support ribs.

The support structure is made of a non-magnetic material.

The non-magnetic material is a thermoplastic or thermosetting plastic, or epoxy resin.

The length of the support structure in an axial direction of the gradient coil is longer or shorter than that of the primary coil set or the secondary coil set.

The support structure is an integral body.

The present invention further provides a magnetic resonance imaging system, characterized by comprising a gradient coil described as above.

The gradient coil according to preferred embodiments of the present invention can reduce the costs of a first filling material and a second filling material; reduce the time for assembling the gradient coil; and reduce the risk of breaking the gradient coil during demolding from a shimming mold.

DESCRIPTION OF THE PREFERRED EMBODIMENTS

In the gradient coil, in addition to the shimming slots, gaps are also present between the primary coil set and the secondary coil set, and the gaps shall be filled with GRP (glass reinforced thermosetting plastic or glass fiber reinforced plastic) grid curtains and GRP bars. Manufacturing GRP grid curtains and assembling GRP bars are time-consuming; and if the gradient coil is relatively thick, more GRP grid curtains and GRP bars are required to fill up the gaps, which results in higher costs and more time being consumed.

Figure 1:
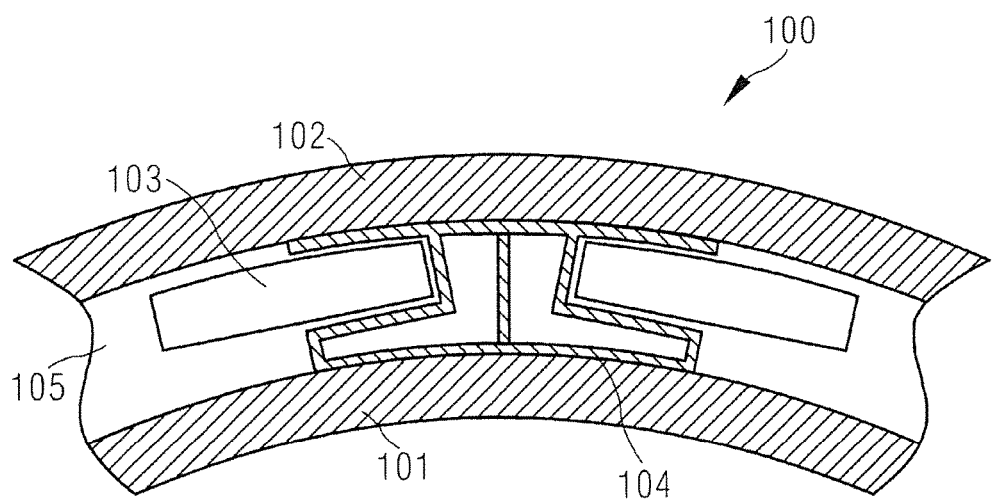
FIG. 1 is a schematic illustration in radial cross section of a portion of a gradient coil according to a first preferred embodiment of the invention.

FIG. 1 is a schematic illustration in radial cross section of a portion of a gradient coil according to a first preferred embodiment of the invention. As shown in FIG. 1, a gradient coil 100 has a primary coil set 101 in a cylindrical shape, a secondary coil set 102 cylindrically sheathed on an outer periphery of the primary coil set 101, a number of shimming slots 103 disposed between the primary coil set 101 and the secondary coil set 102 in a circumferential direction of the gradient coil 100, and one or more support structures 104 located on the outer periphery of the primary coil set 101 to support the secondary coil set 102 in a radial direction of the gradient coil 100.

The gradient coil 100 further has a first filling structure 105 located in regions between the primary coil set 101 and the secondary coil set 102 except the shimming slots 103 and the support structures 104.

Figure 2:
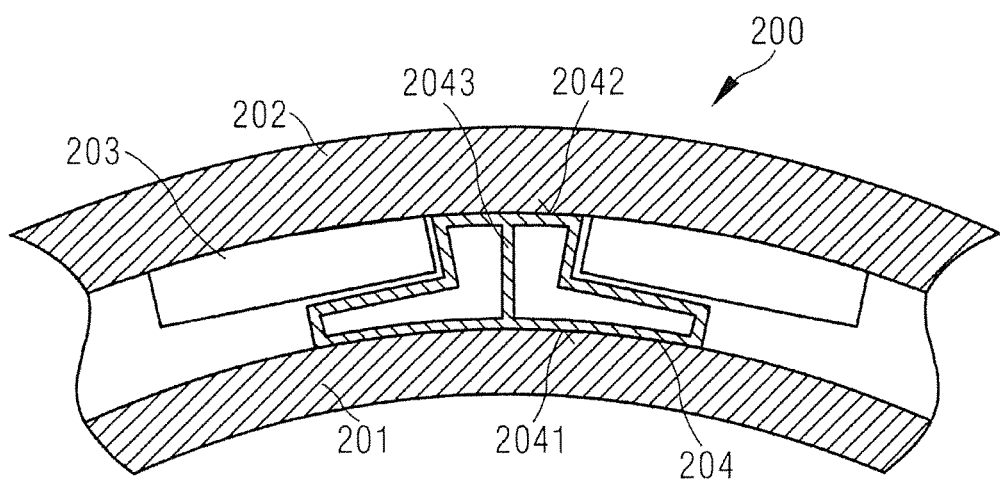
FIG. 2 is a schematic illustration in radial cross section of a portion of a gradient coil according to a second preferred embodiment of the invention.

FIG. 2 is a schematic illustration in radial cross section of a portion of a gradient coil according to a second preferred embodiment of the present invention. As shown in FIGS. 1 and 2, the gradient coil 200 in this embodiment has a primary coil set 201 in a cylindrical shape, a secondary coil set 202 cylindrically sheathed on an outer periphery of the primary coil set 201; a number of shimming slots 203 disposed between the primary coil set 201 and the secondary coil set 202 in a circumferential direction of the gradient coil 200, and one or more support structures 204 located on the outer periphery of the primary coil set 201 to support the secondary coil set 202 in a radial direction of the gradient coil 200.

Specifically, the support structure 204 has a recessed face 2041 fitting with an outer surface of the primary coil set 201; a raised face 2042 fitting with an inner surface of the secondary coil set 202, and a support body 2043 located between the raised face and the recessed face. The recessed face 2041 is located on the primary coil set 201 and supports the secondary coil set 202 outwardly. The support structure 204 is provided with a support body 2043 between the recessed face 2041 and the raised face 2042.

Figure 3:
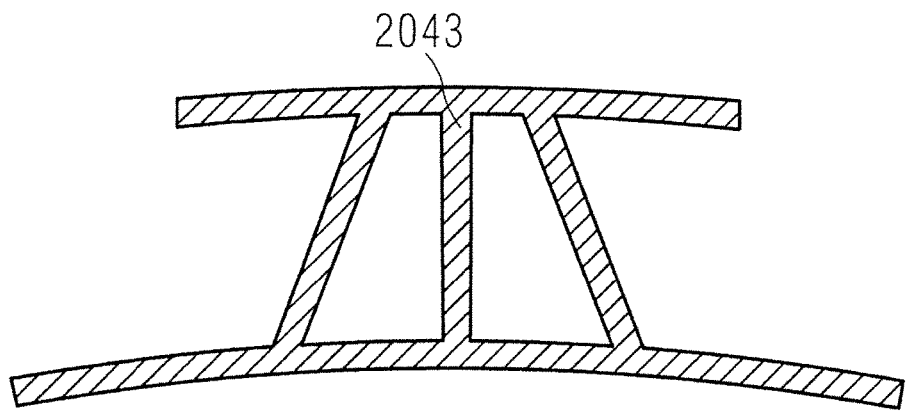
FIG. 3 is a schematic illustration in radial cross section of support structures of a gradient coil according to a third preferred embodiment of the present invention.
Figure 4:
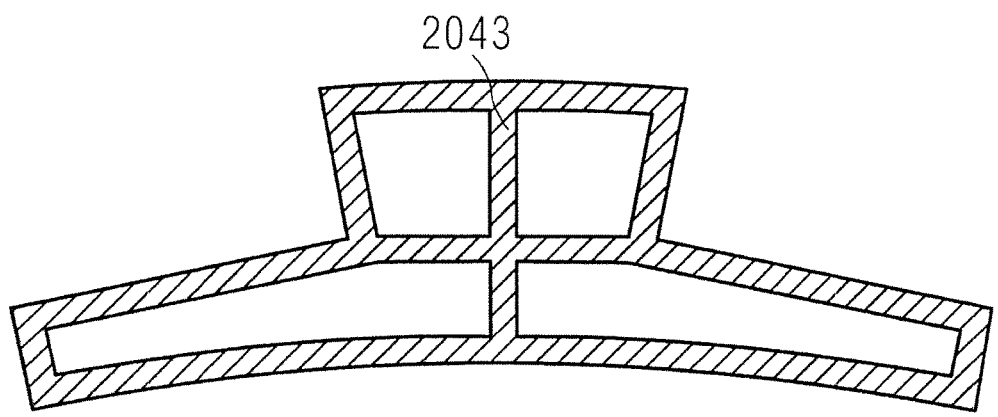
FIG. 4 is a schematic illustration in radial cross section of support structures of a gradient coil according to a fourth preferred embodiment of the present invention.

FIG. 3 is a schematic illustration in radial cross section of support structures of a gradient coil according to a third preferred embodiment of the invention. FIG. 4 is a schematic illustration in radial cross section of support structures of a gradient coil according to a fourth preferred embodiment of the present invention. As shown in FIGS. 3 and 4, the support body 2043 has a number of support ribs. The support ribs have a thickness from about 2 mm to 10 mm. The support ribs extend in a radial or circumferential direction of the gradient coil, and the hollow part of the plurality of support ribs forms a second filling structure. Generally, the support ribs are manufactured by a pultrusion process. This manufacturing process needs a pultrusion mold, and glass fiber impregnated with epoxy resin is extruded from the mold so as to manufacture the support ribs. The support ribs may also be manufactured by thermoplastic injection molding. The first and second filling materials may be epoxy resin or other non-ferromagnetic materials.

Figure 5:
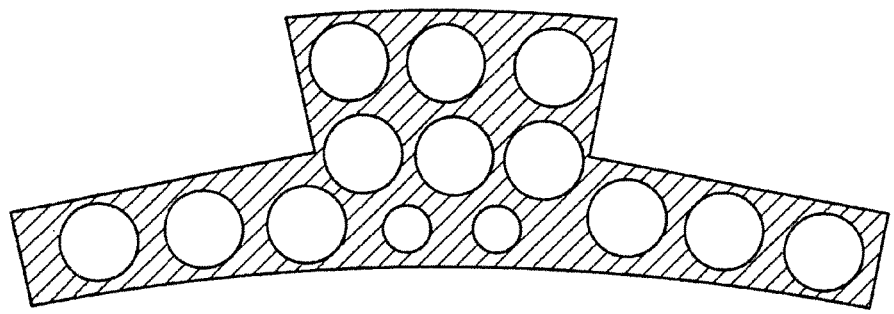
FIG. 5 is a schematic illustration in radial cross section of support structures of a gradient coil according to a fifth preferred embodiment of the present invention.
Figure 6:
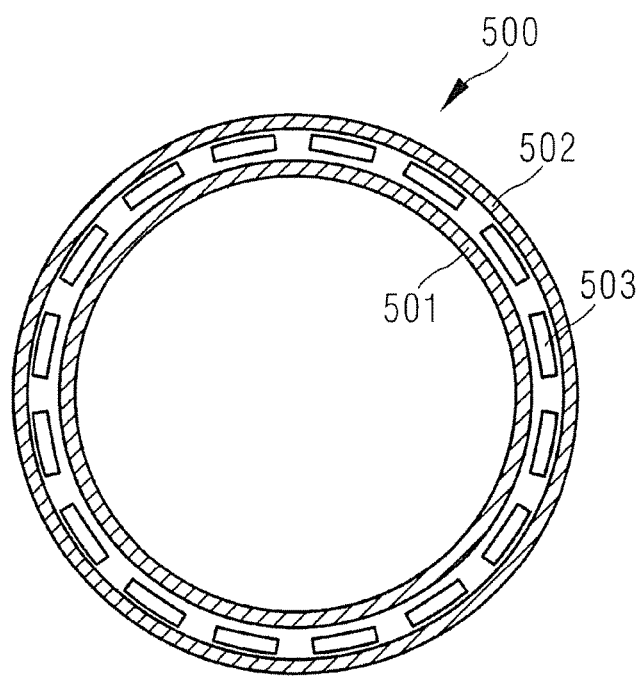
FIG. 6 is a schematic illustration in radial cross section of a gradient coil of a magnetic resonance imaging system according to the prior art.

FIG. 5 is a schematic illustration in radial cross section of support structures of a gradient coil according to a fifth preferred embodiment of the invention. The support structure of the gradient coil according to this fifth preferred embodiment has some voids extending in the axial direction of the gradient coil, and portions except the voids serve as the support structure.

The support structure may be manufactured with any material which has enough strength and rigidity and is non-magnetic, for example, thermoplastic plastics (ABS, PC, etc.) and thermosetting plastics (which can also be reinforced by glass fiber), epoxy resin, etc., and the above-mentioned materials have enough strength and rigidity to support the secondary coil set. As shown in FIGS. 1, 2, 3 and 4, the support structures may have different types of cross section, so that the amounts of the first filling material and the second filling material can be reduced, and this beneficial effect is particularly significant in a relatively thick gradient coil.

In summary, the gradient coil according to preferred embodiments of the invention can reduce the costs of a first filling material and a second filling material; reduce the time for assembling the gradient coil; and reduce the risk of breaking the gradient coil during demolding from a shimming mold. Moreover, the support structure can be customized and may have different types of cross section; the support structure may be of any length in the axial direction of the gradient coil (longer than the primary coil set or the secondary coil set so as to be used for the connection with a fixture or for the fixing to other components; or shorter than the primary coil set or the secondary coil set so as to be used for matching with a fixture or for the fixing to other components), and is a complete body (thus not requiring any previous assembly), thereby saving the assembly time; and the support structure can bear the force from the secondary coil set, so as to reduce the deformation of the shimming strip mold to reduce the risk of rupture.

Although modifications and changes may be suggested by those skilled in the art, it is the intention of the inventor to embody within the patent warranted hereon all changes and modifications as reasonably and properly come within the scope of his contribution to the art.

I claim as my invention:

1. A gradient coil for a magnetic resonance imaging system, comprising:
   a primary coil set in a cylindrical shape;
   a secondary coil set cylindrically sheathed on an outer periphery of the primary coil set, said primary coil set and said secondary coil set having a longitudinal axis that is common to both said primary and said secondary coil sets;
   at least one support structure on an outer periphery of the primary coil set with an entirety of said at least one support structure extending in a direction of said longitudinal axis, that supports the secondary coil set in a radial direction of the primary and secondary coil sets;

a plurality of shimming slots disposed between the primary coil set and the secondary coil set in a circumferential direction of said primary and secondary coil sets;

a filling structure in regions between the primary coil set and the secondary coil set other than the shimming slots and the support structures so that said filling structure supports said shimming slots; and said support structure comprising a raised face fitting with an inner surface of the secondary coil set, a recessed face fitting with an outer surface of the primary coil set, and a support body located between the raised face and the recessed face.

2. The gradient coil as claimed in claim 1, wherein the support body has at least one support rib extending in a radial or circumferential direction of the gradient coil.

3. The gradient coil as claimed in claim 2, further comprising a filling structure between the support ribs.

4. The gradient coil as claimed in claim 1, wherein the support structure is comprised of a non-magnetic material.

5. The gradient coil as claimed in claim 4, wherein that the non-magnetic material is selected from the group consisting of thermoplastics, thermosetting plastics, and an epoxy resin.

6. The gradient coil as claimed in claim 1, wherein a length of the support structure in an axial direction of the gradient coil is longer than that of the primary coil set or the secondary coil set.

7. The gradient coil as claimed in claim 1, wherein a length of the support structure in an axial direction of the gradient coil is shorter than that of the primary coil set or the secondary coil set.

8. The gradient coil as claimed in claim 1, characterized in that the support structure is an integral body.

9. A magnetic resonance imaging apparatus, comprising:

a magnetic resonance scanner;

a gradient coil in said magnetic resonance scanner, said gradient coil comprising a primary coil set in a cylindrical shape, a secondary coil set cylindrically sheathed on an outer periphery of the primary coil set, said primary coil set and said secondary coil set having a longitudinal axis that is common to both said primary and said secondary coil sets, and at least one support structure on an outer periphery of the primary coil set with an entirety of said at least one support structure extending in a direction of said longitudinal axis, that supports the secondary coil set in a radial direction of the gradient coil;

a plurality of shimming slots disposed between the primary coil set and the secondary coil set in a circumferential direction of said primary and secondary coil sets;

a filling structure in regions between the primary coil set and the secondary coil set other than the shimming slots and the support structures so that said filling structure supports said shimming slots;

said support structure comprising a raised face fitting with an inner surface of the secondary coil set, a recessed face fitting with an outer surface of the primary coil set, and a support body located between the raised face and the recessed face; and a control computer configured to operate the magnetic resonance scanner to acquire magnetic resonance data from a subject situated therein, including operating the gradient coil to spatially encode the magnetic resonance data.

* * * * *